(12) United States Patent
Vimercati et al.

(10) Patent No.: US 9,087,578 B2
(45) Date of Patent: Jul. 21, 2015

(54) CONFIGURABLE REFERENCE CURRENT GENERATION FOR NON VOLATILE MEMORY

(71) Applicant: Micron Technology, Inc., Boise, ID (US)

(72) Inventors: Daniele Vimercati, Besana in Brianza (IT); Riccardo Muzzetto, Caponago (IT)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 14/041,585

(22) Filed: Sep. 30, 2013

(65) Prior Publication Data

US 2015/0092470 A1    Apr. 2, 2015

(51) Int. Cl.
*G11C 13/00* (2006.01)
*G11C 7/14* (2006.01)

(52) U.S. Cl.
CPC ............. *G11C 13/004* (2013.01); *G11C 7/14* (2013.01); *G11C 13/0004* (2013.01); *G11C 2013/0045* (2013.01)

(58) Field of Classification Search
CPC ............ G11C 13/004; G11C 13/0004; G11C 13/0002; G11C 2013/0045; G11C 7/14
USPC ............... 365/148, 158, 163, 189.09
See application file for complete search history.

(56) References Cited

U.S. PATENT DOCUMENTS

| | | | |
|---|---|---|---|
| 6,985,383 B2 * | 1/2006 | Tang et al. | 365/171 |
| 7,599,209 B2 * | 10/2009 | Hoenigschmid et al. | 365/148 |
| 7,848,138 B2 | 12/2010 | Bedeschi et al. | |
| 8,243,504 B2 | 8/2012 | Kang et al. | |
| 8,885,428 B2 * | 11/2014 | Chen et al. | 365/207 |
| 2008/0007992 A1 * | 1/2008 | Wang et al. | 365/158 |
| 2014/0063927 A1 | 3/2014 | Willey | |
| 2014/0063928 A1 | 3/2014 | Willey | |
| 2014/0063929 A1 | 3/2014 | Willey | |
| 2014/0063930 A1 | 3/2014 | Willey | |
| 2014/0063931 A1 | 3/2014 | Willey | |

* cited by examiner

*Primary Examiner* — Tan T. Nguyen
(74) *Attorney, Agent, or Firm* — Knobbe, Martens, Olson & Bear, LLP

(57) ABSTRACT

This disclosure relates to generating a reference current for a memory device. In one aspect, a non-volatile memory device, such as a phase change memory device, can determine a value of a data digit, such as a bit, stored in a non-volatile memory cell based at least partly on the reference current. The reference current can be generated by mirroring a current at a node that is biased by a voltage bias. A configurable resistance circuit can have a resistance that is configurable. The resistance of the configurable resistance circuit can be in series between the node and a resistive non-volatile memory element. In some embodiments, a plurality of non-volatile memory elements can each be electrically connected in series between the resistance of the configurable resistance circuit and a corresponding selector.

24 Claims, 6 Drawing Sheets

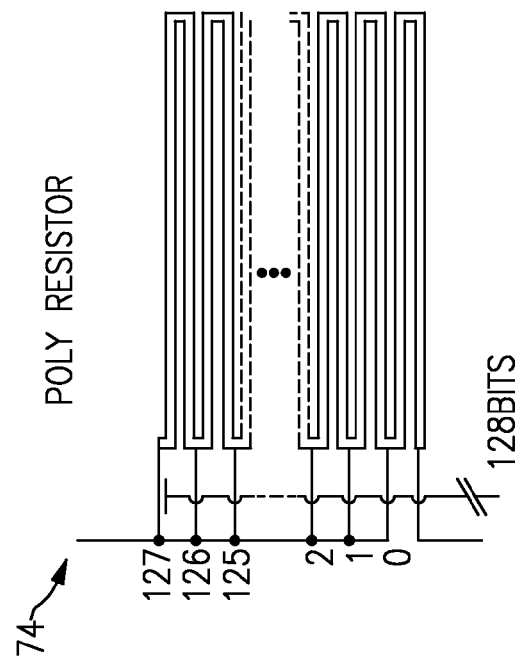
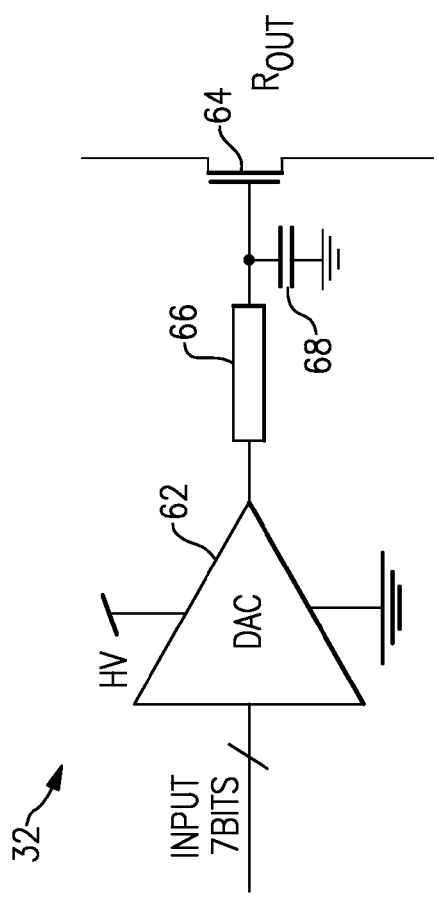
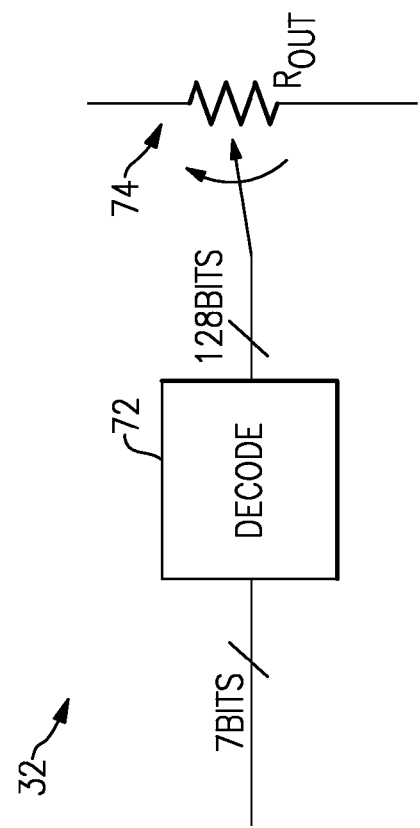

CONFIGURABLE REFERENCE CURRENT GENERATION FOR NON VOLATILE MEMORY

BACKGROUND

1. Technical Field

This disclosure generally relates to electronics, and, in particular, to generating a reference current for a memory device.

2. Description of the Related Technology

Phase change memory (PCM) is a form of non-volatile memory made from a phase-change material. An example of a phase-change material is Germanium-Antimony-Tellurium (GST). When a cell of GST material is heated beyond its melting point and cools relatively rapidly, the phase-change material of the cell is in an amorphous state and can have a resistance associated with a first state, such as logic 0. When the cell of GST material is heated and is cooled relatively slowly, the phase-change material of the cell is in a crystalline state and can have a resistance associated with a second state, such as logic 1. The cell of GST material can also be heated to a relatively lower temperature, such as a temperature associated with crystallization to achieve the crystalline state. Intermediate states are also possible for multi-level cells having more than two states.

Non-volatile memories, such as PCMs, can determine a value of a data digit, such as a bit, stored in a non-volatile memory cell by comparing an indication of current associated with the non-volatile memory cell with an indication of a reference current. A read current can be indicative of a resistance associated with a particular state of a PCM cell. To determine a value of the data digit stored in a PCM cell, a sense amplifier can compare an indication of read current associated with a binary PCM cell with an indication of a reference current to determine whether the PCM cell stores a logic 0 or a logic 1 value.

In a PCM array, there can be a distribution of read currents for detecting each state of a PCM cell. For example, for an array of binary PCM cells, there can be a distribution of read currents for reading logic 0 and another distribution of read currents for reading logic 1 from PCM cells of the array. Accordingly, it can be desirable to have as large of a read margin as possible. A read margin can be the mean distance between the tails of the read current distributions for different states of a PCM cell. Variations in read current relative to the reference current can undesirably reduce read margin. Such a reduction in read margin can, in some instances, result in read errors when incorrect values are determined for particular memory cells.

Accordingly, a need exists for improved generation of a reference current in a non-volatile memory device.

BRIEF DESCRIPTION OF THE DRAWINGS

These drawings and the associated description herein are provided to illustrate specific embodiments of the invention and are not intended to be limiting.

FIG. 5 is a schematic diagram of a configurable resistance circuit, according to an embodiment.

FIG. 6A is a schematic diagram of a configurable resistance circuit, according to another embodiment.

FIG. 6B is a diagram of a configurable resistor of FIG. 6A.

To avoid repetition of description, components having the same or similar function may be referenced by the same reference number.

DETAILED DESCRIPTION OF CERTAIN EMBODIMENTS

Although particular embodiments are described herein, other embodiments, including embodiments that do not provide all of the benefits and features set forth herein, will be apparent to those of ordinary skill in the art.

Figure 1:
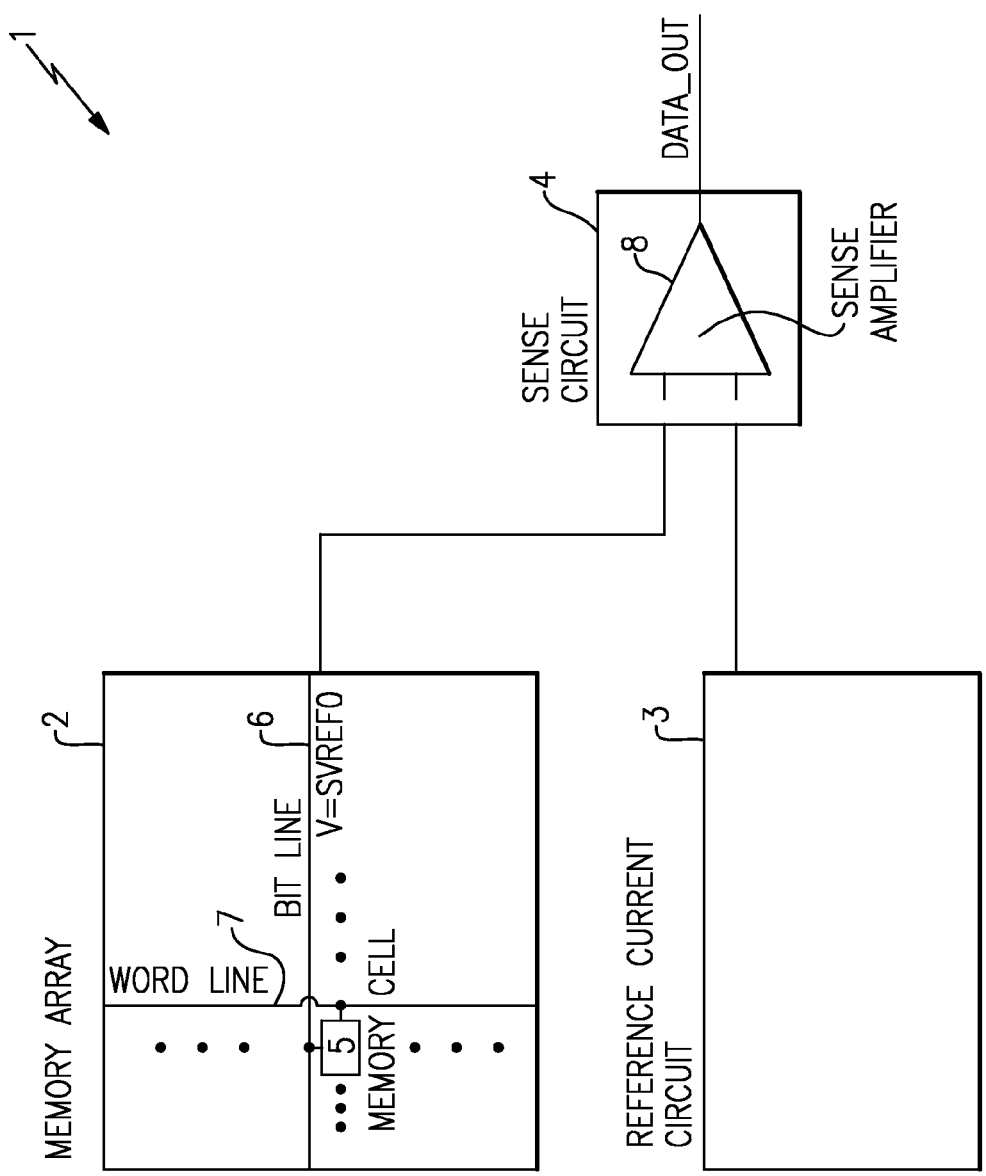
FIG. 1 is a block diagram of a memory device.

FIG. 1 is a block diagram of an illustrative memory device 1. The memory device 1 can be, for example, a PCM device. The memory device 1 includes a memory array 2, a reference current circuit 3, and a sense circuit 4. It will be understood that in some embodiments the memory device 1 can include more or fewer elements than illustrated.

The memory array 2 can include a plurality of memory cells 5 configured to store data. Each of the memory cells 5 can include a resistive non-volatile memory element, such as a PCM element, and a selector. The non-volatile memory element can be in series in the selector. The non-volatile memory element can be electrically coupled to a bit line 6. The bit line 6 electrically coupled to a selected memory cell 5 can be biased to a bias voltage $V_{SREF0}$. The selector of a memory cell 5 can be activated based on a word line 7. The selector can be a bipolar transistor, for example. In this example, applying a ground potential to the word line 7 electrically connected to the base of the selector can generate a read current indicative of a state of the non-volatile memory element of the selected memory cell 5 electrically connected to the bit line 6. Other suitable selectors, such as a field effect transistor, can be used in other implementations.

The reference current circuit 3 is configured to generate a reference current for use in determining the state of the selected memory cell 5 of the array 2. The read current on the bit line 6 can be converted to a voltage, for example, by storing charge on a capacitor. The read current can be converted to a voltage by circuitry of the array 2 or circuitry of the sense circuit 4. Similarly, the reference current can be converted to a voltage, for example, by storing charge on a capacitor. The reference current can be converted to a voltage by circuitry of the reference current circuit 3 or circuitry of the sense circuit 4. One embodiment of the reference current circuit 3 will be described in greater detail later in connection with a reference current circuit 30 of FIG. 4.

The sense circuit 4 can include a sense amplifier 8 configured to compare a voltage associated with the reference current and a voltage associated with the read current indicative of a resistance of the resistive non-volatile memory element of the selected memory cell 5. When the read current is greater than the reference current, the selected memory cell 5 can be in a logic 1 state. When the read current is less than the reference current, the selected memory cell 5 can be in a logic 0 state. It will be understood that the opposite convention can alternatively be adopted. By comparing a read current with a reference current, the sense amplifier 8 can determine the state, such as logic 0 state or logic 1 state, of the selected memory cell 5.

It can be desirable to have a relatively large read margin to ensure proper operation of a memory device, such as a PCM device. The reference current circuit 3 can be configured to generate a reference current that is approximately a mean current between the worst case currents associated with different logical states in some instances. As technology evolves and smaller devices are used, the reference current can decrease. With smaller reference currents, noise in the reference current can have a greater effect on the reference current. For instance, noise on the order of 10s of millivolts on a reference voltage can result in a significant different in currents. Accordingly, it can be desirable to generate a reference current that is more tolerant to noise than previous reference currents in order to maintain or improve read margin. Reference current circuits described herein can reduce or eliminate noise on the reference current from various sources, such as voltage noise on a voltage reference used to bias a reference current circuit 3 and/or variation of selectors in the array 2.

Figure 2:
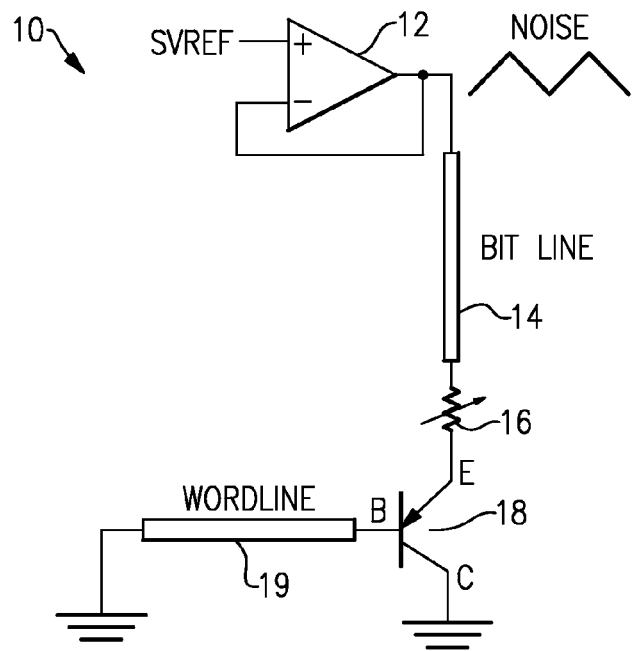
FIG. 2 is schematic diagram of a reference current circuit that generates a reference current that can be uncorrelated with a reference voltage.

FIG. 2 is a schematic diagram of a reference current circuit 10 that generates a reference current that can be uncorrelated with a reference voltage. The reference current circuit 10 can implement the reference current circuit 3 of FIG. 1. As illustrated, the reference current circuit 10 includes a differential amplifier 12, a bit line 14, a PCM element 16, and a selector 18. The differential amplifier 12 is configured to receive a reference voltage $S_{VREF}$ and a feedback signal and to apply a bias voltage approximately equal to the reference voltage $S_{VREF}$ on the bit line 14. A reference current $I_{REF}$ can be selected to correspond to a current flowing through the PCM element 16 having a resistance of $R_{REF}$. The resistance $R_{REF}$ of the PCM element 16 can be adjustable. The resistance $R_{REF}$ and be configured such that the reference current $I_{REF}$ is approximately a mean current between the worst case currents associated with different logical states of PCM cells in an array. A word line 19 electrically connected to a base of the selector 18 can be configured at a ground potential.

As discussed above, to determine a data digit stored in a selected PCM cell 5 in the array 2 of FIG. 1, an indication of the reference current $I_{REF}$ can be compared to a current flowing through a PCM element of the selected PCM cell 5. The selected PCM cell 5 can be biased by biasing an associated bit line 6 to a reference voltage $S_{VREF0}$ and biasing a selector in series with the selected PCM element by applying a ground potential a word line 7 electrically connected to the base of the selector. Ideally, the reference voltage $S_{VREF}$ biasing the bit line 14 of the reference current circuit 10 and the reference voltage $S_{VREF0}$ biasing a bit line 6 of the array 2 of FIG. 1 would be equal to each other. In some instances, these reference voltages $S_{VREF0}$ and $S_{VREF}$ can be generated by a single reference voltage circuit. However, these reference voltages $S_{VREF0}$ and $S_{VREF}$ may be different from each other due to noise.

A reference voltage $S_{VREF0}$ applied to a bit line 6 of the array 2 of FIG. 1 electrically connected to the selected PCM cell 5 and the reference current $I_{REF}$ may not be correlated with each other. The reference voltage $S_{VREF0}$ applied to the bit line 6 can experience noise from a variety of sources, such as voltage noise, temperature variation, process variation, trimming error, switching noise, and the like. Such noise can cause a variation in the voltage value of the reference voltage $S_{VREF0}$ applied to the bit line 6. Accordingly, a current flowing through the selected PCM element in the memory cell 5 in the array 2 of FIG. 1 can change due to a change in voltage bias while the reference current $I_{REF}$ remains substantially constant and independent of variation in the reference voltage $S_{VREF0}$ applied to the bit line 6. Alternatively or additionally, the reference voltage $S_{VREF}$ applied to the bit line 14 of the reference current circuit 10 can experience noise that changes $I_{REF}$ in a manner that is uncorrelated with changes in the reference voltage $S_{VREF0}$ applied to a bit line 6 of the array 2 of FIG. 1.

When the reference voltage reference $S_{VREF0}$ applied to the bit line 6 of a selected PCM cell 5 in the array 2 changes, it may be desirable to change the reference current $I_{REF}$ to maintain the read margin. However, the reference current circuit 10 can experience a reduction in read margin as a result of noise on the voltage reference $S_{VREF0}$ applied to the bit line 6 in the array 2.

Figure 3:
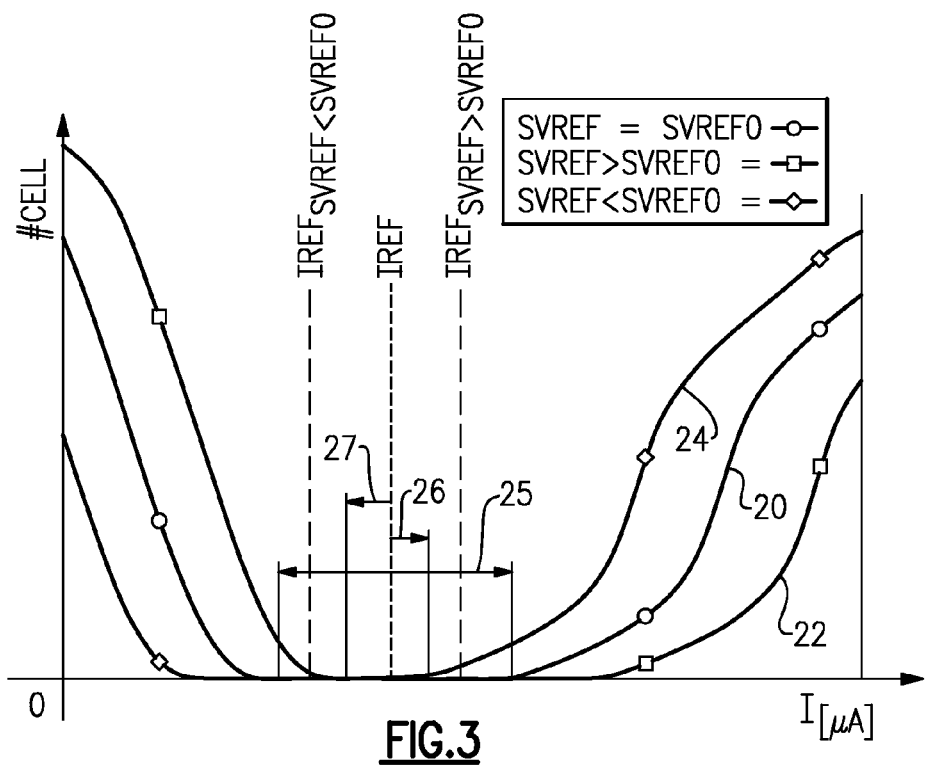
FIG. 3 is a plot illustrating a relationship among read currents for phase change memory (PCM) cells of an array for different bias voltages.

FIG. 3 is a plot illustrating a relationship among read currents for PCM cells of an array for different bias voltages. Three curves show a distribution of read currents and a corresponding number of cells of a PCM array for different reference voltages $S_{VREF0}$ biasing bit lines electrically connected to the PCM cells while the bias voltage for the bit line 14 of the reference current circuit 10 of FIG. 2 remains constant. Each of these curves includes two portions: a first portion corresponding to a logic 0 state of a PCM cell and a second portion corresponding to a logic 1 state of the PCM cell. The first portion begins at zero current and extends to the highest current corresponding to one or more PCM cells being in the logic zero state. The second portion begins at the lowest current corresponding to one or more PCM cells being in a logic 1 state and extends to a maximum current corresponding to one or more PCM cells being in the logic 1 state.

A first curve 20 illustrates the distribution of read currents for PCM cells when the voltage reference $S_{VREF0}$ biasing a selected bit line of the array is equal to the voltage reference $S_{VREF}$ in the reference current circuit 10. A reference current $I_{REF\ SVREF=SVREF0}$ is approximately the mean current between tails of the first portion and the second portion of the first curve 20. The reference current $I_{REF}$ can be determined experimentally, for example, during testing of a PCM device. With the reference current $I_{REF}$, a read margin 25 can be optimized for a PCM array corresponding to the first curve 20.

A second curve 22 illustrates the distribution of read currents for PCM cells when the voltage reference $S_{VREF0}$ biasing a selected bit line of the array is greater than the voltage reference $S_{VREF}$ in the reference current circuit. With a larger voltage reference bias ($S_{VREF0} > S_{VREF}$ instead of $S_{VREF0} = S_{VREF}$), the current read from PCM cells in the array 2 is larger independent of the PCM cells being in the logic 0 or in the logic 1 state. Accordingly, the second curve 22 shifts to the right of the first curve 20 in FIG. 3. With the reference current $I_{REF}$ centered around tails of the current distribution of the curve 20, the low margin 27 between the reference current $I_{REF}$ and the tail of the logic 0 current distribution of the curve 22 is reduced relative to the margin on the low side of the curve 20. To center a reference current between the tails of the current distributions of the logic 0 and logic 1 states of the curve 22, the reference current $I_{REF}$ can be adjusted to $I_{REF\ SVREF>SVREF0}$ in accordance with embodiments disclosed herein.

A third curve 24 illustrates the distribution of read currents for PCM cells when the voltage reference $S_{VREF0}$ biasing a selected bit line of the array is less than the voltage reference $S_{VREF}$ in the reference current circuit. With a smaller voltage reference bias ($S_{VREF0} < S_{VREF}$ instead of $S_{VREF0} = S_{VREF}$), the current read from PCM cells in the array 2 is smaller independent of the PCM cells being in the logic 0 or in the logic 1 state. Accordingly, the third curve 24 shifts to the left of the first curve 20 in FIG. 3. With the reference current $I_{REF}$ centered between tails of the current distribution of the curve 20, the high margin 26 between the reference current $I_{REF}$ and the tail of the logic 1 current distribution of the curve 24 is reduced relative to the margin on the high side of the curve 20. To center a reference current between the tails of the current distributions of the logic 0 and logic 1 states of the curve 24, the reference current $I_{REF}$ can be adjusted to $I_{REF\ SVREF<SVREF0}$ in accordance with embodiments disclosed herein.

Accounting for variations in reference voltage corresponding to the curves 22 and 24 of FIG. 2, the read margin for the reference current $I_{REF}$ centered with respect to the curve 20 can be reduced to the low margin 27 plus the high margin 26 indicated in FIG. 3. The reference current circuit 10 can experience such a reduction in read margin equal to the read margin 25 for when the reference voltages $S_{VREF}$ and $S_{VREF0}$ are equal minus the sum of the low margin 27 and the high margin 26 indicated in FIG. 3. The reference current circuits of FIGS. 4 and 8 can adjust the reference current $I_{REF}$ to be centered or otherwise repositioned between the tails of the distributions of current for memory cells at different states. Accordingly, the reference current circuits of FIGS. 4 and 8 can maintain a read margin as the voltage reference $S_{VREF0}$ of the array varies relative to the voltage reference $S_{VREF}$ of the reference current circuit.

The reference current circuit 10 of FIG. 1 should not account for variation in array selectors. For instance, in bipolar transistor array selectors, there can be variations in an emitter to base voltage $V_{EB}$ due to physical variations between different array selectors. The array selectors can have physical variations within a die. Alternatively or additionally, array selectors can have physical variations from die to die. Variation in the array selectors can account for another source of error in the reference current relative to the read current from a selected memory cell. This can result in a reduction in read margin. In some instances, such a mismatch can result in a data digit being determined incorrectly. The reference current circuits of FIGS. 4 and 8 can account for variation in array selectors when generating the reference current $I_{REF}$.

Figure 4:
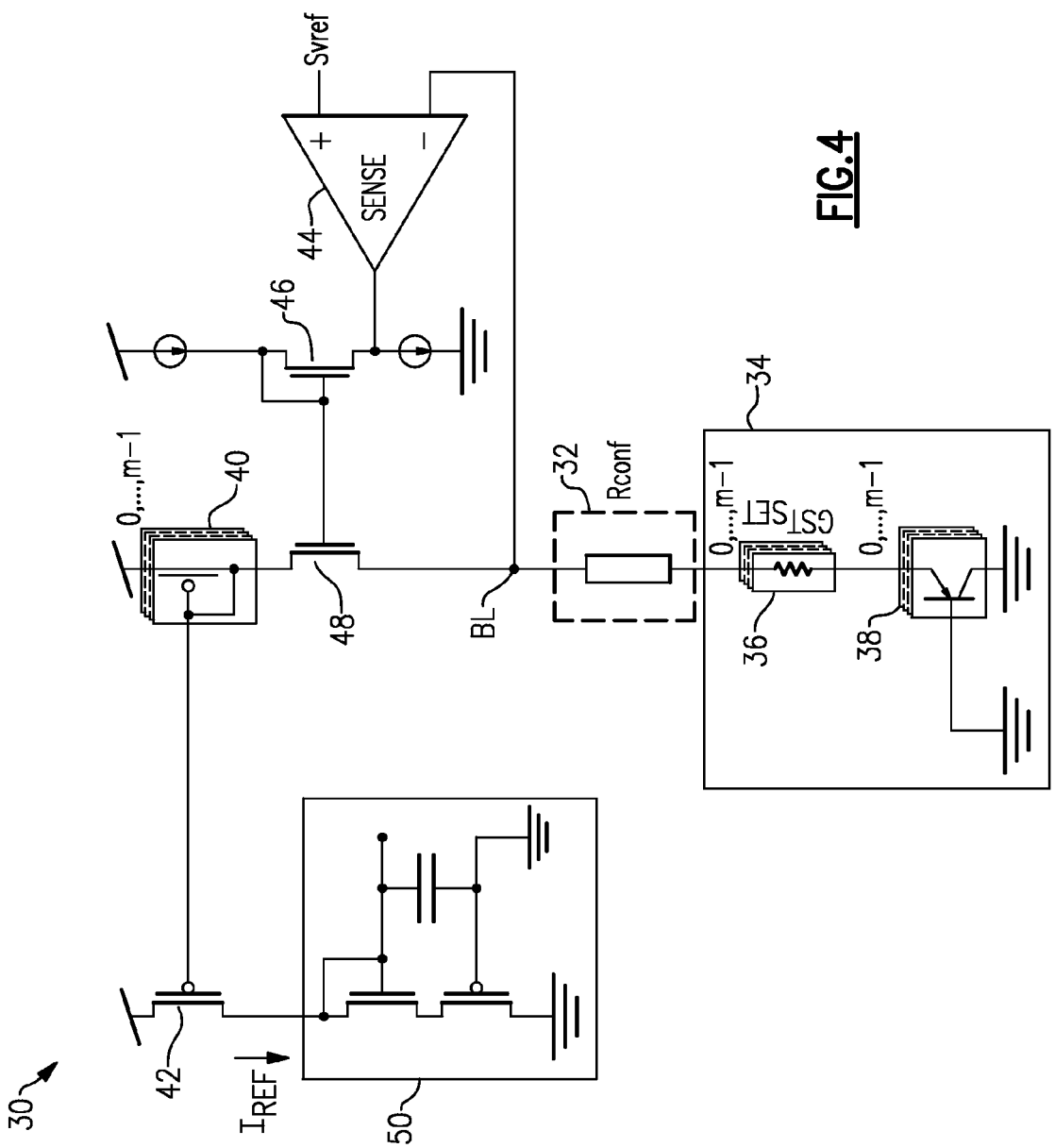
FIG. 4 is a schematic diagram of a reference current circuit, according to an embodiment.

FIG. 4 is a schematic diagram of the reference current circuit 30, according to an embodiment. The reference current circuit 30 is one embodiment of the reference current circuit 3 of FIG. 1. The reference current circuit 30 can generate a reference current $I_{REF}$ to reduce or minimize effects of differences between a reference voltage biasing a selected bit line in the array and a reference voltage biasing a bit line in the reference current circuit 30. The reference current circuit 30 can generate a reference current $I_{REF}$ while accounting for variations in the reference current due to selector variation according to certain embodiments.

As illustrated, the reference current circuit 30 includes a configurable resistance circuit 32, a replica array 34, a biasing circuit 44/46/48 configured to bias the bit line BL, and a current mirror 40/42 configured to generate the reference current $I_{REF}$ by mirroring current on the bit line BL. The biasing circuit can provide a voltage at a first node, such as the bit line BL. The configurable resistance circuit 32 has a resistance that is configurable. The replica array 34 can include one or more resistive non-volatile memory elements, such as phase change memory elements. Each of the one or more resistive non-volatile memory elements can be electrically coupled to a corresponding selector. A resistive non-volatile memory elements of the replica array 34 can be operatively coupled to the configurable resistance circuit 32 such that the resistance of the configurable resistance circuit is in series between the first node and the resistive non-volatile memory element. The current mirror 40/42 can mirror current at the first node to generate a reference current $I_{REF}$ for determining a data digit stored in the memory array 2 of FIG. 1. The reference current circuit 30 can also include a current to voltage conversion circuit 50. Alternatively, the current to voltage conversion circuit 50 can be part of the sense circuit 4. In some embodiments, the reference current circuit 30 can include more or fewer elements than shown in FIG. 4.

The reference current circuit 30 can include a biasing circuit that can provide a voltage bias to a node disposed in a signal path between the current mirror 40/42 and the replica array 34. For example, the node receiving the voltage bias can correspond to the node connecting the configurable resistance circuit 32 and a current mirror 48/46 of the biasing circuit. For example, the biasing circuit can provide a voltage bias to the bit line BL. As illustrated, the biasing circuit includes an amplifier 44, a diode-connected transistor 46, and a biasing transistor 48. In one embodiment, the amplifier 44 is an operational amplifier. The biasing circuit can apply a voltage bias to the bit line BL based on a reference voltage $S_{VREF}$ and feedback. The amplifier 44 can receive the reference voltage $S_{VREF}$ at a positive input terminal, and a voltage of the bit line BL at a negative input terminal.

The amplifier 44 can provide an output voltage to a source of the diode-connected transistor 46. The gate of the biasing transistor 48 can be electrically connected to the gate of the diode-connected transistor 46 so that the gate voltage of the biasing transistor 48 is the same as the gate voltage of the diode-connected transistor 46. Due to the operation of the feedback loop from the output of the amplifier 44 to the diode-connected transistor 46 to the biasing transistor 48 and to the inverting input of the amplifier 44, the amplifier 44 generates an output voltage for the source of the diode-connected transistor 46 such that the voltage on the bit line node BL is about equal to the reference voltage Svref. Currents to the inputs of the amplifier 44 can be negligibly small. The biasing circuit can be matched to a corresponding biasing circuit in the array 2 of FIG. 1. This can apply a similar bias and/or offset to the bit line BL of the reference current circuit 30 as to a bit line 6 of the array 2 of FIG. 1.

The reference current circuit 30 includes a configurable resistance circuit 32 having a resistance that is configurable. The resistance can be adjusted once or multiple times. The configurable resistance circuit 32 can set the resistance to cause the reference current $I_{REF}$ to be at a desired current level. For instance, the configurable resistance circuit 32 can cause the reference current $I_{REF}$ to be adjusted to a desired current corresponding to variation in a voltage bias, similar to moving the reference current $I_{REF}$ to a current level corresponding to $I_{REF\ SVREF>SVREF0}$ and/or $I_{REF\ SVREF<SVREF0}$ in FIG. 3. When the resistance of the configurable resistance circuit 32 is a relatively high resistance, the reference current $I_{REF}$ should be lower than when the resistance of the configurable resistance circuit 32 is a relatively low resistance. By increasing and/or decreasing the resistance of the configurable resistance circuit 32, the reference current $I_{REF}$ can be set to a desired current level.

The resistance of the configurable resistance circuit 32 is a series resistance between the bit line BL and one or more resistive non-volatile memory elements, such as one or more PCM elements 36. The resistance of the configurable resistance circuit 32 can be selected to set the reference current $I_{REF}$ such that the reference current $I_{REF}$ is at approximately a mean current value between the tails of the logic 0 and logic 1 distributions for memory cells in the array. This can increase, and in some instances maximize, read margin. In one embodiment, the configurable resistance circuit 32 can be configured during testing of a memory device such that the resistance has a selected value. Alternatively or additionally, the configurable resistance circuit 32 can adjust the resistance during operation of the memory device.

FIGS. 5 to 6B are schematic diagrams of the configurable resistance circuit 32 of FIG. 4 according to certain embodiments. As shown in FIG. 5, the configurable resistance circuit 32 can include a digital-to-analog converter 62 configured to apply a voltage to a gate of a field effect transistor 64. The field effect transistor 64 can operate in the Ohmic region. Accordingly, the field effect transistor 64 can operate as a linear resistor having a resistance of $R_{OUT}$ from source to drain. Different gate voltage values provided to the gate of the field effect transistor 64 by the digital-to-analog converter 62 can adjust the resistance of $R_{OUT}$ from source to drain of the field effect transistor 64. The resistance $R_{OUT}$ can be in series between the bit line BL and the one or more PCM elements 36 of FIG. 4.

As illustrated, the digital-to-analog converter 62 receives a 7 bit input and converts the 7 bit input to an analog output voltage. It will be understood that the input to the digital-to-analog converter 62 can have a different number of bits in other implementations. For instance, the different number of input bits provided to the digital-to-analog converter 62 can depend on design constraints and/or on a desired precision of the analog output voltage. A conductive line 66 and a capacitor 68 can function as a low pass filter between the output of the digital-to-analog converter 62 and the gate of the field effect transistor 64.

The input to the digital-to-analog converter 62 can be set and/or adjusted in a variety of other ways. An input to the digital-to-analog converter 62 can be set during calibration of a memory device in one embodiment. According to another embodiment that will be discussed later in more detail with reference to FIG. 8, the input provided to the digital-to-analog converter 62 can be based at least partly on a temperature compensation value.

Another embodiment of the configurable resistance circuit 32 is shown in FIGS. 6A and 6B. As shown in FIG. 6A, the configurable resistance circuit 32 can include a decoder 72 and a variable resistance circuit 74. The output of the decoder 72 can adjust how much resistance the variable resistance circuit 74 includes in the resistance $R_{OUT}$. The resistance $R_{OUT}$ can be in series with the PCM elements 36 of FIG. 4. The resistance $R_{OUT}$ can be a series resistance coupled between the one or more PCM elements 36 and the bit line BL of the reference current circuit 30 of FIG. 4. As illustrated, the decoder 72 receives a 7 bit input and generates a 128 bit output. It will be understood that the input to the decoder 72 can receive a different number of input bits and/or generate a different number of output bits in other implementations. The number of input and output bits of the decoder 72 can be selected based on design constraints and/or a desired precision of the resistance of the variable resistance circuit 74.

As shown in FIG. 6B, the variable resistance circuit 74 can configure the resistance $R_{OUT}$ by electrically coupling a selected node of a series string of polysilicon resistors or resistor segments to an output of the variable resistance circuit 74 by selecting the node via a switch. For instance, the series string of polysilicon resistors can be electrically coupled to the one or more PCM elements 36 of FIG. 4 and the output of the decoder 72 can turn on a selected one of the transistors to couple a selected node of the string of polysilicon resistors to the bit line BL of FIG. 4. In other instances (not illustrated), the series string of polysilicon resistors can be electrically coupled to the bit line BL of FIG. 4 and the output of the decoder 72 can turn on a selected one of the transistors to couple a selected node of the string of polysilicon resistors to the one or more PCM elements 36 of FIG. 4. In the illustrated embodiment, there are 128 transistors that can electrically couple 128 nodes of the series string of polysilicon resistors to provide one of 128 different resistance values for the variable resistance circuit 74.

The input to the decoder 72 can be set and/or adjusted in a variety of other ways. An input to the decoder 72 can be set during calibration of a memory device in one embodiment. According to another embodiment that will be discussed later in more detail with reference to FIG. 7, the input provided to the decoder 72 can be based at least partly on a temperature compensation value.

Referring back to FIG. 4, the reference current circuit 30 can include a replica array 34. The replica array 34 can include one or more PCM cells. In one embodiment, the replica array 34 comprises PCM cells that each includes a PCM element 36 and a selector 38. The one or more PCM cells can be electrically coupled in parallel with each other. It can be advantageous to replicate a portion an array of non-volatile memory cells to generate the reference current $I_{REF}$. This can increase matching between the biasing conditions of the reference current circuit 30 and the array from which data is read. The replica array 34 can be physically separate from the array 2 of FIG. 1 in some instances. In other instances, the replica array 34 can be included as part of the array 2 of FIG. 1. The replica array 34 can include from about 10 to 50 PCM cells in some instances. In certain implementations, 10 to 20 PCM cells can be included in the replica array 34. When the one or more PCM elements 36 include a plurality of PCM elements, each of the plurality of PCM elements can be electrically coupled in parallel with each other. The one or more PCM elements 36 in the replica array can be functional PCM elements. For example, the one or more PCM elements 36 can each be configured to different states, such as logic 0 or logic 1.

The replica array 34 can include one or more PCM elements 36 operatively coupled to the resistance of the configurable resistance circuit 32. A corresponding selector 38 can be in series with each of the one or more PCM elements 36. As illustrated, the selector 38 can be a bipolar transistor. The base of the bipolar transistor can be biased to a ground potential, the collector can be electrically coupled to a ground potential, and the collector can be electrically coupled to a PCM element 36.

M PCM elements 36 and M selectors 38 can be included in the replica array 34, where M is a positive integer two or greater. As noted above, in certain embodiments M can be about 10 to 50, such as about 10 to 20. By having M selectors 38 each electrically connected to a respective PCM element 36, a mismatch between any particular selector 38 of the replica array 34 and any particular selector in the array 2 of FIG. 1 can be reduced. Including M selectors 38 in series with the resistance of the configurable resistance circuit 32 can average out a difference, such as a voltage from emitter to base $V_{EB}$, from any particular PCM cell in the array 2 of FIG. 1 due to selector variation.

Figure 7:
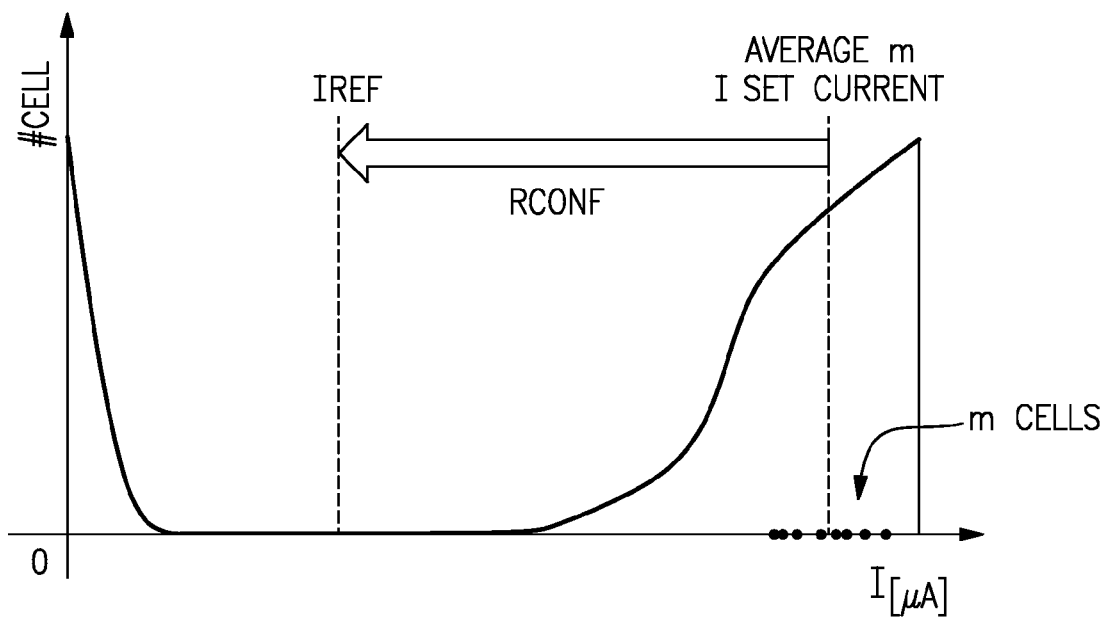
FIG. 7 is a plot illustrating a relationship among an average set current of PCM cells and a reference current.

FIG. 7 is a plot illustrating a relationship among an average current associated with a logic 1 state $I_{SET}$ of PCM cells and a reference current $I_{REF}$ generated by the reference current circuit 30. The M cells in the replica array 34 can on average generate a current associated with a logic 1 state that is close to the average current associated with a logic 1 state of a memory cell of the array 2 of FIG. 1. FIG. 7 plots currents associated with a logic 1 state of M PCM cells of the replica array 34 and the current distribution for memory cells of the array 2 of FIG. 1. The configurable resistance circuit 32 can adjust the average current associated with the logic 1 state $I_{SET}$ of PCM cells in the replica array 34 to a current value $I_{REF}$ that results in a desirable read margin. The currents flowing through the PCM cells in the replica array 34 can be additive on the bit line BL. A current mirror of the reference current circuit 30 can average the currents flowing through the PCM elements 36 in the replica array 34 to generate the reference current $I_{REF}$.

Referring back to FIG. 4, the current from the PCM elements 36 in the replica array 34 can be mirrored by a current mirror that includes transistors 40 and 42. The transistor 40 can be a diode connected transistor. The transistors 40 and 42 can be insulated gate field effect transistors, such as p-type field effect transistors. In certain embodiments, the transistor 40 can include M transistors in parallel with each other. The M parallel transistors 40 can average the current from the M PCM elements 36 on the bit line BL. The current on the bit line BL can pass through a transistor 48 in series between the current mirror and the series circuit that includes the configurable resistance circuit 32 and the replica array 34. The reference current $I_{REF}$ flowing through the transistor 42 can correspond to an average current flowing through the M PCM elements 36, adjusted by the resistance $R_{OUT}$ of the configurable resistance circuit 32.

Also illustrated in FIG. 4 is a current to voltage conversion circuit 50. The current to voltage conversion circuit 50 can convert the reference current $I_{REF}$ to a voltage. The voltage is an indication of the reference current $I_{REF}$ that can be used by the sense amplifier 8 in the sense circuit 4 of FIG. 1 to determine a data digit read from the array 2 of FIG. 1.

Figure 8:
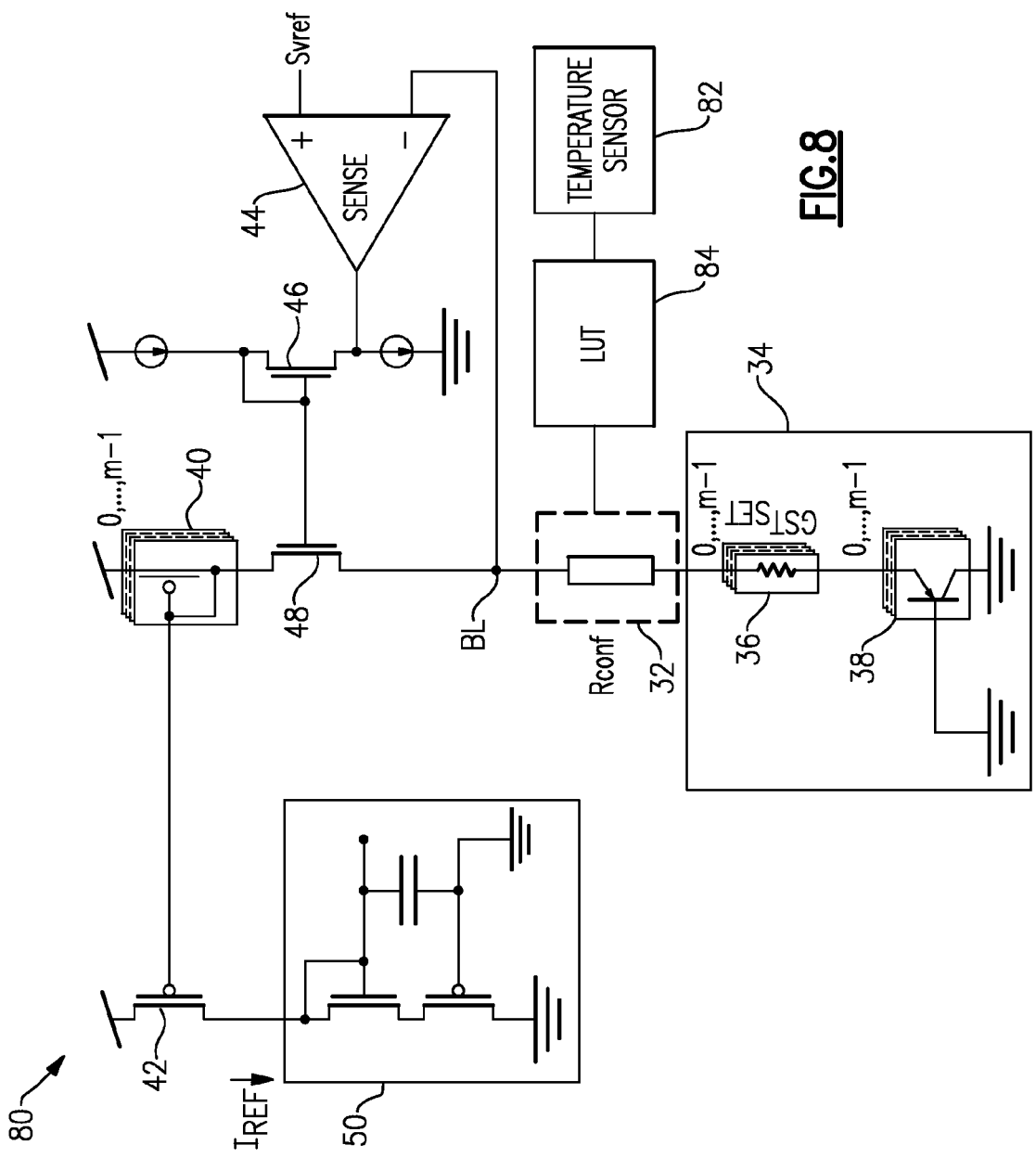
FIG. 8 is a schematic diagram of a reference current circuit with temperature compensation, according to an embodiment.

FIG. 8 is a schematic diagram of a reference current circuit 80 with temperature compensation, according to an embodiment. The reference current circuit 80 is another embodiment of the reference current circuit 3 of FIG. 1. The reference current circuit 80 adds temperature compensation functionality to the reference current circuit 30. Accordingly, the reference current circuit 80 can include any combination of features of the reference current circuit 30. The reference current circuit 80 includes a temperature sensor 82 configured to generate an indication of temperature. The indication of temperature can represent a temperature of the memory device 1 of FIG. 1. A lookup table (LUT) 84 can receive the indication of temperature form the temperature sensor 82. In one embodiment, the LUT 84 can include an analog-to-digital converter, a processor, and a memory to store values for the lookup table. The LUT 84 can further include switches or control signal outputs for switches to select the appropriate segments of the configurable resistance circuit 32. The LUT 84 can store temperature compensation values corresponding to various temperatures of the memory device. In certain embodiments, the LUT can store multiple temperature compensation values corresponding to a single temperature. The different temperature compensation values can correspond to different operations of the memory device 1 of FIG. 1. For instance, different temperature compensation values can be stored in the LUT 84 for reading from the array, verifying a logic 0 was written to the array 2 of FIG. 1, verifying a logic 1 was written to the array 2 of FIG. 1, and the like. The LUT 84 can include different temperature compensation values for a corresponding temperature in one LUT or in separate LUTs for each type of memory operation. A temperature compensation value from the LUT 84 can be provided to the configurable resistance circuit 32 based on the indication of temperature generated by the temperature sensor 82. When multiple temperature compensation values correspond to a single temperature, selection circuitry can select a particular value to provide a selected temperature compensation value associated with the single temperature to the configurable resistance circuit 32. For instance, a multiplexer can provide a selected temperature compensation value from the LUT 84 to the configurable resistance circuit 32 based on one or more mode select signals.

While this disclosure may describe examples in connection with PCMs for illustrative purposes, the principles and advantages described herein may be applied to other suitable types of memory. The principles and advantages described herein can be applied to any memory in which a reference current is used to determine a state of a memory element. For example, any combination of features described herein can be applied to any resistive non-volatile memory cells that include a memory element that has different resistances in different states, which can be detected when determining data read from such memory cells. Some examples of resistive non-volatile memory cells that have memory elements with different resistances in different states include PCM elements, resistive random-access memory (RRAM or ReRAM) elements, magnetoresistive random access memory (MRAM) elements, and the like.

The reference currents discussed herein can be used in a variety of memories in accordance with the principles and advantages described herein. A memory device, such as a PCM device, according to the embodiments described above can be incorporated in various electronic devices. Examples of the electronic devices can include, but are not limited to, consumer electronic products, electronic circuits, electronic circuit components, parts of the consumer electronic products, electronic test equipment, etc. Examples of the consumer electronic products include, but are not limited to, a mobile phone, a telephone, a television, a computer monitor, a computer, a hand-held computer, a laptop computer, a tablet computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi-functional peripheral device, a wrist watch, a clock, etc. Further, the electronic device can include unfinished products.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment. Moreover, it will be understood that any of the methods discussed herein may include greater or fewer operations and that the operations may be performed in any order, as appropriate.

Various embodiments have been described above. Although described with reference to these specific embodiments, the descriptions are intended to be illustrative and are not intended to be limiting. Various modifications and applications may occur to those skilled in the art.

We claim:

1. An apparatus comprising a non-volatile memory device, the non-volatile memory device comprising:
   a biasing circuit configured to provide a voltage at a first node;
   a configurable resistance circuit having a resistance that is configurable;
   a resistive non-volatile memory element operatively coupled to the configurable resistance circuit such that the resistance of the configurable resistance circuit is in series between the first node and the resistive non-volatile memory element; and
   a current mirror configured to mirror current at the first node to generate a reference current for determining a data digit stored in an array of resistive non-volatile memory elements.

2. The apparatus of claim 1, wherein the resistive non-volatile memory element comprises a phase change memory element.

3. The apparatus of claim 1, wherein the non-volatile memory device comprises a plurality of resistive non-volatile memory elements in parallel with each other and each operatively coupled to the resistance of the configurable resistance circuit.

4. The apparatus of claim 3, further comprising a plurality of selectors, wherein each of the plurality of resistive non-volatile memory elements is electrically connected to a selector of the plurality of selectors.

5. The apparatus of claim 4, wherein the plurality of selectors comprise bipolar transistors having emitters electrically connected to corresponding resistive non-volatile memory elements.

6. The apparatus of claim 3, wherein the current mirror comprises a plurality of transistors in parallel each configured to receive the current at the first node.

7. The apparatus of claim 6, wherein the plurality of transistors in parallel with each other in the current mirror includes M transistors, wherein the plurality of resistive non-volatile memory elements includes M resistive non-volatile memory elements, and wherein M is a positive integer that is two or greater.

8. The apparatus of claim 1, wherein a transistor of the biasing circuit is electrically coupled between the resistance of the configurable resistance circuit and the current mirror.

9. The apparatus of claim 1, wherein the non-volatile memory device further comprises:
   a temperature sensor configured to generate an indication of temperature; and
   a lookup table configured to store temperature compensation values;
   wherein the configurable resistance circuit is configured to receive a particular temperature compensation value from the lookup table based at least partly on the indication of temperature, and to adjust the resistance based at least partly on the particular temperature compensation value.

10. The apparatus of claim 9, wherein the lookup table is configured to store temperature compensation values associated with different types of memory operations, and wherein the configurable resistance circuit is configured to receive the particular temperature compensation value based at least partly on a type of memory operation being executed by the non-volatile memory device.

11. The apparatus of claim 1, wherein the configurable resistance circuit comprises a field effect transistor having a gate configured to receive an output from a digital-to-analog converter, and wherein the resistance comprises the resistance between a source and a drain of the field effect transistor.

12. The apparatus of claim 1, wherein the configurable resistance circuit comprises a plurality of polysilicon resistors or resistor segments selectively electrically coupleable in series between the resistive non-volatile memory element and the current mirror.

13. The apparatus of claim 1, wherein the biasing circuit is configured to receive a reference voltage and generate the voltage, wherein the biasing circuit comprises circuitry matched to biasing circuit used to bias a bit line in the array of resistive non-volatile memory elements.

14. The apparatus of claim 1, further comprising:
   the array of resistive non-volatile memory elements; and
   a compare circuit configured to compare an indication of the reference current with an indication of a current associated with read from a selected resistive non-volatile memory element of the array.

15. A memory device comprising:
   an array of phase change memory cells configured to store data;
   a reference current circuit comprising:
      a biasing circuit configured to provide a voltage at a first node;
      a configurable resistance circuit having a resistance that is configurable;
      a phase change memory element operatively coupled to the configurable resistance circuit such that the resistance of the configurable resistance circuit is in series between the first node and the phase change memory element; and
      a current mirror configured to mirror current at the first node to generate a reference current; and
   a sense circuit configured to determine a value of a data digit stored in a selected phase change memory element in the array based at least partly on an indication of the reference current and an indication of a current associated with the selected phase change memory element.

16. The device of claim 15, wherein the reference current circuit comprises M phase change memory elements each operatively coupled to the resistance of the configurable resistance circuit, and wherein M is a positive integer that is two or greater.

17. The device of claim 16, wherein the current mirror comprises M transistors in parallel with each other and configured to receive the current from the first node.

18. The device of claim 16, wherein each of the M phase change memory elements is in series with a respective selector.

19. The device of claim 15, further comprising:
   a temperature sensor configured to generate an indication of temperature; and
   a lookup table configured to store temperature compensation values;
   wherein the configurable resistance circuit is configured to receive a particular temperature compensation value from the lookup table corresponding to the indication of temperature, and to adjust the resistance of the configurable resistance circuit based at least partly on the particular temperature compensation value.

20. An electronically implemented method of generating a reference current, the method comprising:
   biasing a first node with a voltage bias, wherein a configurable resistance of a configurable resistance circuit is in series between the first node and a resistive non-volatile memory element; and generating a reference current by mirroring a current at the first node with a current mirror.

21. The method of claim 20, wherein generating the reference current comprises using a plurality of transistors in parallel with each other to mirror current the current at the first node, and wherein a plurality of resistive non-volatile memory elements are in parallel with each other and are each operatively coupled to the first node.

22. The method of claim 20, further comprising determining a state of a selected resistive non-volatile memory element in an array of resistive non-volatile memory elements based at least partly on an indication of current associated with the resistive non-volatile memory element and the reference current.

23. The method of claim 20, further comprising detecting an indication of temperature, and adjusting the configurable resistance of the configurable resistance circuit based at least partly on the indication of temperature.

24. The method of claim 20, further comprising adjusting the configurable resistance of the configurable resistance based so as to increase the read margin for reading data from an array of resistive non-volatile memory cells.

\* \* \* \* \*